(12) United States Patent
Lucovsky

(10) Patent No.: US 6,686,264 B2
(45) Date of Patent: Feb. 3, 2004

(54) METHODS OF FORMING BINARY NONCRYSTALLINE OXIDE ANALOGS OF SILICON DIOXIDE

(75) Inventor: Gerald Lucovsky, Cary, NC (US)

(73) Assignee: North Carolina State University, Raleigh, NC (US)

( * ) Notice: Subject to any disclaimer, the term of this patent is extended or adjusted under 35 U.S.C. 154(b) by 0 days.

(21) Appl. No.: 10/341,302

(22) Filed: Jan. 13, 2003

(65) Prior Publication Data

US 2003/0139026 A1 Jul. 24, 2003

Related U.S. Application Data

(62) Division of application No. 09/434,607, filed on Nov. 5, 1999, now Pat. No. 6,552,403.

(51) Int. Cl.$^7$ ............................................. H01L 21/3205
(52) U.S. Cl. .......................................... 438/585; 438/591
(58) Field of Search .......................... 438/591, 585–650

(56) References Cited

U.S. PATENT DOCUMENTS

| | | | | |
|---|---|---|---|---|
| 5,466,629 A | * | 11/1995 | Mihara et al. ............... 437/60 |
| 5,481,490 A | * | 1/1996 | Watanabe et al. ........... 365/145 |
| 5,824,560 A | | 10/1998 | Van Der Wel et al. | |
| 5,970,332 A | | 10/1999 | Pruijmboom et al. | |
| 6,063,677 A | | 5/2000 | Rodder et al. | |

OTHER PUBLICATIONS

Alers et al.; *Intermixing at the Tantalum Oxide/Silicon Interface in Gate Dielectric Structures,* Applied Physics Letters 73:11 1517–1519 (1998).

An et al.; *Ellipsometric Examination of Growth and Dissolution Rates of Ta$_2$O$_5$ Films Formed by Metalorganic Chemical Vapor Deposition,* J. Electrochem. Soc. 139:7 1956–1962 (Jul. 1992).

Chatterjee et al.; *CMOS Metal Replacement Gate Transistors using Tantalum Pentoxide Gate Insulator,* Int'l. Electron Devices meeting, San Francisco, CA, Dec. 6–9, 1998, pp. 29.1.1–29.1.4.

Davis et al.; *Evolution of the Chemistry of Passive Films of Sputter–Deposited, Supersaturated Al Alloys,* J. Electrochem. Soc. 137:2: 422–427 (Feb. 1990).

Frankel et al.; *Pitting of Sputtered Aluminum Alloy Thin Films,* J. Electrochem. Soc. 136:4 1243–1244 (Apr. 1989).

Hara et al.; *Formulation of Al$_2$O$_3$–Ta$_2$O$_5$ Double–Oxide Thin Films by Low–Pressure MOCVD and Evaluation of Their Corrosion Resistances in Acid and Alkali Solutions,* J. Electrochem. Soc. 146:2 510–516 (1999).

Hashimoto et al.; *Recent studies of chemical properties of Amorphous Alloys,* Materials Science and Engineering A133:22–25 (1991).

He et al.; *A 1.1 nm Oxide Equivalent Gate Insulator Formed Using TiO$_2$ on Nitrided Silicon,* Int'l. Electron Devices meeting, San Francisco, CA, Dec. 6–9, 1998, pp. 21.8.1–21.8.3.

Hori; *Gate Dielectrics and MOS ULSIs Principles, Technologies, and Applications,* Springer–Verlag Berlin Heidelberg, Germany 1997.

International Search Report, PCT/US00/41608, Apr. 13, 2001.

Kim et al.; *Deposition of Device Quality Silicon Dioxide Thin Films by Remote Plasma Enhanced Chemical Vapor Deposition,* J. Vac. Sci. Technol. A 6: 3 1740–1744 (1988).

(List continued on next page.)

*Primary Examiner*—Roy Potter
(74) *Attorney, Agent, or Firm*—Myers Bigel Sibley & Sajovec

(57) ABSTRACT

A non-crystalline oxide is represented by the formula:

$$ABO_4$$

wherein A is an element selected from Group IIIA of the periodic table; and B is an element selected from Group VB of the periodic table.

19 Claims, 2 Drawing Sheets

OTHER PUBLICATIONS

Kizilyalli et al.; *MOS Transistors with Stacked $SiO_2$–$Ta_2O_5$–$SiO_2$ Gate Dielectrics for Giga–Scale integration of CMOS Technologies*, IEEE Electron Device Letters 19:11 423–425 (1998).

Klap et al.; *Polar Growth and Directional Adsorption of Large $AIPO_4$–5 Crystals Determined by Scanning Pyroelectric Microscopy*, Chem. Mater. 11:3497–3503 (1999).

Lee et al.; *Reliability of nitrided Si–$Sio_2$ interfaces formed by a new, low–temperature, remote–plasma process*, J. Vac. Sic. Technol. B 13:4 1788–1793 (Jul./Aug 1995).

Lee et al.; *Nitrogen–Atom Incorporation at Si–$SiO_2$ Interfaces by a Low–Temperature (300° C.), Pre–Deposition, Remote–Plasma Oxidation Using $N_2O$*, J. Vac. Sci. Technol. A 13:3 1671–1675 (1995).

Luan et al.; *Ultra Thin High Quality $Ta_2O_5$ Gate Dielectric Prepared by In–situ Rapid Thermal Processing*, Int'l. Electron Devices meeting, San Francisco, CA, Dec. 6–9, 1998, pp. 21.7.1.–21.7.4.

Lucovsky et al.; *Mimization of Suboxide Transition Regions at Si–$SiO_2$ Interfaces by 900° C. Rapid Thermal Annealing*, J. Vac. Sci. Technol. B 15:4 1074–1079 (1997).

Lucovsky et al.; *Optimization of Nitrided Gate Dielectrics by Plasma–Assisted and Rapid Thermal Processing*, J. Vac. Sci. Technol. A 16: 3 1721–1729 (1998).

Lucovsky et al.; *Plasma Enhanced Chemical Vapor Deposition: Differences Between Direct and Remote Plasma Excitation*, J. Vac. Sci. Technol. A 5:4 2231–2238 (1987).

Lucovsky et al.; *The Effects of Subcutaneous Oxidation at the Interfaces Between Elemental and Compound Semiconductors and $SiO_2$ Thin Films Deposited by Remote Plasma Enhanced Chemical Vapor Deposition*, J. Vac. Sci. Technol. B 7:4 861–869 (1989).

Manchanda et al.; *Gate Quality Doped High K Films for CMOS Beyond 100 nm: 3—10nm $Al_2O_3$ with Low Leakage and Low Interface States*, Int'l. Electron Devices meeting, San Francisco, CA, Dec. 6–9, 1998, pp. 21.6.1–21.6.4.

McKee et al.; *Crystalline Oxides on Silicon: The First Five Monolayers*, Physical Review Letters 81:14 3014–3017 (Oct. 5, 1998).

McKee et al.; *Crystalline Oxides on Silicon–Alternative Dielectrics for Advanced Transistor Technologies*, Mat. Res. Soc. Symp. Proc. 567:415–425 (1999).

Niimi et al.; *A New Low Thermal Budget Approach to Interface Nitridation for Ultra–Thin Silicon Dioxide Gate Dielectrics by Combined Plasma–Assisted and Rapid Thermal Processing*, AIP Conf. Proceedings 449, Characterization and Metrology of ULSI Technology, (1998) pp. 273–277.

Park et al.; *Transistor Characteristics with $Ta_2O_5$ Gate Dielectric*, IEEE Electron Device Letters 19:11 441–443 (1998).

Parker et al.; *Ultrathin Oxide–Nitride Gate Dielectric MOSFET's*, IEEE Electron Device Letters 19:4 106–108 (Apr. 1998).

Richard et al.; *Remote plasma enhanced CVD deposition of silicon nitride and oxide for gate insulators in (In, Ga) As FET devices*, J. Vac. Sci. Technol. A 3:3 867–872 (May/Jun. 1985).

Roy et al.; *Stacked high–$\epsilon$ gate dielectric for gigascale integration of metal–oxide–semiconductor technologies*, Applied Physics Letters 72:22 2835–2837 (Jun. 1, 1998).

Roy et al.; *Synthesis of Ultra–thin stacked oxides using low pressure single furnace cluster process*, Mat. Res. Soc. Symp. Proc. 473:89–94 (1997).

Russak et al.; *Reactive Magnetron Sputtered Zirconium Oxide and Zirconium Silicon Oxide Thin Films*, J. Vac. Sci. Technol. A 7:3 1248–1253 (1988).

Shinriki et al.; *UV–$O_3$ and Dry–$O_2$: Two–Step Annealed Chemical Vapor–Deposited $Ta_2O_5$ Films for Storage Dielectrics of 64–Mb DRAM's*, IEEE Transactions on Electron Devices 38:3 455–462 (Mar. 1991).

Streinz et al.; *A Microellipsometric Study of the Passive Film Formation on Al–Ta Alloys I. Solid Solution Alloys*, J. Electrochem. Soc. 141:5 1126–1131 (May 1994).

Streinz et al.; *A Microellipsometric Study of the Passive Film Formation on Al–Ta Alloys II. The Role of $Al_3Ta$ Precipitates in Breakdown*, J. Electrochem. Soc. 141:5 1132–1137 (May 1994).

Taylor et al.; *Does Chemistry Really Matter in the Chemical Vapor Deposition of Titanium Dioxide? Precurosor and Kinetic Effects on the Microstructure of Polycrystalline Films*, J. Am. Chem. Soc. 121:22 5220–5229 (1999).

van Dover et al.; *Deposition of Uniform Zr–Sn–Ti–O Films by On–Axis Reactive Sputtering*, IEEE Electron Device Letters 19:9 329–331 (1998.

Yan et al.; *Structural and Electrical Characterization of $TiO_2$ Grown From Titanium Tetrakis–Isopropoxide (TTIP) Ant $TTIP/H_2O$ Ambients*, J. Vac. Sci. Technol. B 14:3 1706–1711 (1996).

Yang et al.; *Integration of Ultrathin (1.6~2.0 nm) RPECVD Oxynitride Gate Dielectrics into Dual Poly–Si Gate Submicron CMOSFETs*, Int'l. Electron Devices meeting, Washington, DC, Dec. 5–8, 1999, pp. 10.2.1–10.2.4.

Yasuda et al. *Low–Temperature Formation of Device–Quality $SiO_2$/Si Interfaces by a Two–Step Remote Plasma–Assisted Oxidation/Deposition Process*, J. Vac, Sci. Technol. B 10:4 1844–1851 (1992).

Yasuda et al. *Low–Temperature Preparation of $SiO_2$/Si(100) Interfaces Using a Two–Step Remote Plasma–Assisted Oxidation–Deposition Process*, Appl. Phys. Lett. 60: 4 434–436 (1992).

Yoshioka et al.; *Passivity and its Breakdown on Sputter–Deposited Amorphous Al–Early Transition Metal Alloys in 1 M HC1 at 30° C.*, Corrosion Science 31:349–354 (1990).

* cited by examiner

METHODS OF FORMING BINARY NONCRYSTALLINE OXIDE ANALOGS OF SILICON DIOXIDE

CROSS-REFERENCE TO RELATED APPLICATION

This application is a divisional of application Ser. No. 09/434,607, filed Nov. 5, 1999 (now U.S. Pat. No. 6,552,403), entitled Binary Non-Crystalline Oxide Analogs of Silicon Dioxide for Use in Gate Dielectrics, assigned to the assignee of the present application, the disclosure of which is hereby incorporated herein by reference in its entirety as if set forth fully herein.

FIELD OF THE INVENTION

The invention generally relates to oxides that may be used in conjunction with integrated circuit devices, and methods of making the same.

BACKGROUND OF THE INVENTION

The Semiconductor Industry Association (SIA) National Technology Roadmap for Semiconductors (NTRS) currently projects that gate dielectrics with oxide equivalent thicknesses, ($t_{ox,eq}$), below 1 nm may be potentially desirable for use in complementary metal-semiconductor oxide field-effect transistor (CMOS FET) devices having channel lengths scaled to below 50 nm. Conventional devices may become increasingly undesirable since direct tunneling through silicon dioxide ($SiO_2$) may significantly exceed a nominal limit of approximately 1 A/cm² at applied gate bias levels of about 1 V above threshold for an oxide equivalent thickness of less than 1.5 nm.

One possible approach for decreasing $t_{ox,eq}$ without increasing tunneling leakage current is based on substituting alternative oxides with dielectric constants (k) that could potentially exceed that of $SiO_2$, which has a k value of approximately 3.8. As an example, it would be desirable to obtain oxides with dielectric constants ranging from approximately 10 to 30. Silicon nitride alloys and silicon oxynitride alloys have been proposed as a technology bridge since these materials are believed to have dielectric constants of approximately 7.6 and 5.5 to 6.0 respectively. More specifically, C. J. Parker, G. Lucovsky and J. R. Hauser, *IEEE Electron. Device Lett.* (1998); Y. Wu and G. Lucovsky, *IEEE Electron. Device Lett.* (1998); and H. Yang and G. Lucovsky, *IEDM Digest*, (1999) propose oxide-nitride and oxide-oxynitride alloy stacked dielectrics with $t_{ox,eq}$ projected to be greater than about 1.1 nm before tunneling leakage at approximately 1 V is increased above 1 A/cm². The preparation of these stacked dielectrics proposes two 300° C. remote plasma process steps: i) plasma-assisted oxidation to form Si—$SiO_2$ interface layers ranging in thickness from about 0.5 to 0.6 nm, and ii) remote plasma-enhanced chemical vapor deposition (RPECVD) to deposit either a nitride or an oxynitride (e.g., $(SiO_2)_x(Si_3N_4)_{1-x}$) dielectric film in the dielectric stack. After deposition, a low thermal budget, e.g., 30 second, 900° C., rapid thermal anneal (RTA) has been proposed in an attempt to achieve chemical and structural relaxation. This RTA may promote optimized performance in IGFET devices [G. Lucovsky, A. Banerjee, B. Hinds, G. Claflin, K. Koh and H. Yang, *J. Vac. Sci. Technol.* B15, 1074 (1997)]. Stacked nitride and oxynitride gate dielectrics are capable of displaying improved performance and reliability with respect to thermally-grown oxides of the same equivalent thickness. Nonetheless, these gate dielectrics typically should have $t_{ox,eq}$ of greater than 1.1 nm in order to attempt to maintain direct tunneling leakage below 1 A/cm². The nitride and oxynitride layers of these devices may be sufficiently thick to minimize or stop boron out-diffusion out of p⁺ polycrystalline Si gate electrodes in the p-channel IGFETs [Y. Wu, et al., Vac. Sci. Technol. B17 1813 (1999)].

The use of other high-k dielectrics (e.g., a k greater than 8) has been proposed and includes $TiO_2$ [J. Yan, D. C. Gilmer, S. A. Campbell, W. L. Gladfelter and P. G. Schmid, *J. Vac. Sci. Technol.* B 14, 1706 (1996).], $Ta_2O_5$ [H. Shinrike and M. Nakata, *IEEE Trans. on Elec. Devices* 38, 544 (1991)], $Al_2O_3$ [L. Manchanda, W. H. Lee, J. E. Bower, F. H. Baumann, W. L. Brown, et al., *IEDM Tech. Dig.*, p. 605 (1998)], $ZrO_2$, [R. B. van Dover, et al., *IEEE Electron Device Lett.*, 19, 329, (1998)] and $Zr(Hf)O_2$—$SiO_2$ (also designated as Zr(Hf)-silicates; see van Dover et al.). Notwithstanding any possible benefits, it is generally believed that these materials may not demonstrate the targeted goals of capacitance with decreased tunneling or leakage currents that are desirable for silicon CMOS devices with $t_{ox,eq}$ less than 1 nm, and extending to 0.5 nm to 0.6 nm. Although not wishing to be bound by any theory, it is believed that the performance of the materials may be limited due to the oxidation of the silicon substrate that occurs during thermal chemical vapor deposition (CVD) or during post-deposition processing, such as, for example, thermal anneals, to fully oxidize the deposited thin films.

Other potential problems encountered with various high-k dielectrics may relate to: (1) the crystallization of the deposited films during either deposition or post-deposition processing, (2) the low dielectric constants of the bulk films that may be insufficient to meet the targeted goals, and (3) the formation of interfacial silicide bonds, e.g., Si—Ta bonds, during the initial stages of film deposition for an oxide including, for example, $Ta_2O_5$. For example, it is believed that oxidation of the silicon substrate during deposition or post-deposition processing may mitigate many of the gains of high-k layers with respect to achievable capacitance, whereas crystallization has the potential to open up alternative conduction pathways, the possibility of anisotropic dielectric constant behavior, and the potential to produce surface roughening.

The formation of interfacial silicide bonds may undesirably result in interfacial defects. Such defects may possibly occur in the form of fixed positive charge or interface traps. Thus, it may be desirable to employ a thin dielectric interface layer of $SiO_2$ between the dielectric layer and the silicon substrate. Utilizing such interfacial layers with known insulating film dielectrics, however, may be disadvantageous in that they may limit the dielectric stacks from having sufficient capacitance to meet the ever-increasing scaling demands of CMOS devices. Additionally, this use of interfacial layers may also limit the incorporation of high-k oxides into devices that employ semiconductor substrates other than silicon such as, for example, silicon carbide, gallium nitride and compound semiconductors such as GaAs, (Al,Ga)As, and (In,Ga)As.

Thus, there is a need in the art for oxides that may be employed as insulating dielectrics in microelectronic devices which may address the above-mentioned problems.

SUMMARY OF THE INVENTION

In one aspect, the invention relates to non-crystalline oxides. The non-crystalline oxides are represented by the formula (I):

$ABO_4$ wherein A is an element selected from Group IIIA of the periodic table and B is an element selected from Group VB of the periodic table.

In another aspect, the invention relates to methods of forming non-crystalline oxides represented by the formula (I). The methods comprise delivering gaseous sources comprising element A, gaseous sources comprising element B, and gaseous sources comprising oxygen on substrates such that the gaseous sources comprising element A, the gaseous sources comprising element B, and the gaseous sources comprising oxygen react to form the non-crystalline oxides. Elements A and B are preferably available in equal amounts required for compositional stoichiometry, and wherein the gaseous sources comprising oxygen preferably contains a sufficient amount of chemically active oxygen such that the elements A and B are completely oxidized.

In another aspect, the invention relates to field effect transistors which employ the non-crystalline oxides represented by the formula (I). The field effect transistors comprise integrated circuit substrates having first surfaces, source and drain regions in the substrates at the first surfaces in spaced apart relationships, and gate insulating layers on the substrates at the first surfaces between the spaced apart source and drain regions. The gate insulating layers comprise non-crystalline oxides represented by the formula (I). Source, drain, and gate contacts are provided to contact the source and drain regions and the gate insulating layer, respectively.

The non-crystalline oxides may be employed in field effect transistors as thin gate insulating layers having high dielectric constants. Advantageously, the non-crystalline oxides potentially allow for field effect transistors employing the same to possess gate capacitance in excess of what may be achieved with conventional insulating layers with significantly reduced direct tunneling currents. As an example, the direct tunneling currents may be reduced from levels in excess of 1 A/cm².

DETAILED DESCRIPTION OF THE PREFERRED EMBODIMENTS

Figure 1:
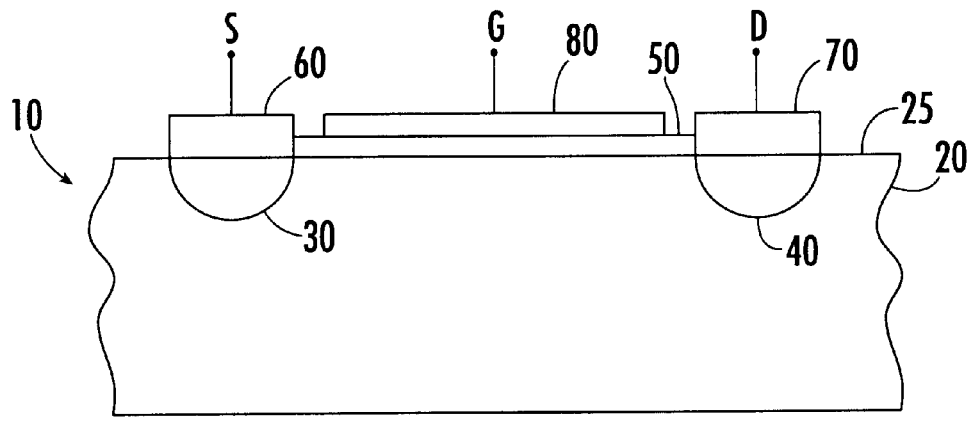
FIG. 1 illustrates a first embodiment of a field effect transistor comprising a non-crystalline oxide gate insulating layer of the invention.

The present invention now will be described more fully hereinafter with reference to the accompanying drawings and examples, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will also be understood that when a layer is referred to as being "on" another layer or substrate, it can be directly on the other layer or substrate, or intervening layers may also be present.

In one aspect, the invention relates to non-crystalline oxides represented by the formula (I):

$ABO_4$ wherein A is an element selected from Group IIIA of the periodic table; and B is an element selected from Group VB of the periodic table. The A and B elements may be present in a number of structural arrangements including, but not limited to, those set forth herein. For example, in one embodiment, the non-crystalline oxides may be described with the A and B elements (atoms) being each four-fold coordinated to the oxygen atoms in an approximate tetrahedral bonding arrangement. For the purposes of the invention, the term "approximate" refers to the bond angles of these tetrahedra being capable of differing by as much as 10 to 15 degrees from the ideal bond angle of 109.47 degrees. In another embodiment, the A and B elements in the non-crystalline oxide may be present in a planar arrangement. In a preferred embodiment, the non-crystalline oxides may be represented as having a repeating unit illustrated by the formula (II):

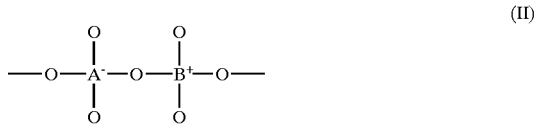

(II)

wherein A and B are defined above.

In the above embodiments, the A element groups are unit negatively charged (e.g., $AO_{4/2}^-$) and the B element groups are unit positively charged (e.g., $BO_{4/2}^+$). Preferably, the A element groups and the B element groups are arranged in a covalently bonded structure through bridging oxygen atoms in which the opposite A and B element groups are oppositely charged. The covalently bonded structure may represented in a chemically ordered fashion with the random aspect being contained in wide distributions of bond and dihedral angles. In other words, the non-crystalline oxides may be in the form of networks comprised of corner-connected tetrahedral local bonding groups described as random covalent networks (RCNs). Not wishing to be bound by theory, it is believed that the configurations of the non-crystalline oxides may be attributable to their lack of long range atomic order, e.g., atomic order that extends beyond the second-nearest neighbor of a given atom. In certain embodiments, the networks of the invention may also include other interconnections of constituent tetrahedra such as those found in metal silicates, e.g., edge, rather than corner connection, potentially without altering dielectric and dielectric properties that may be potentially significant in, for example, microelectronic applications (e.g., band-gaps, band off-set energies, and their defect properties such as low concentrations of fixed oxide charge and oxide traps). Again not wishing to be bound by any theory, the potential absence of long range order beyond second-nearest neighbors may be derived from two possible sources: (1) a wide distribution of bond angles at the bridging atom or oxygen sites, e.g., 145 degrees, +/−approximately 25 to 30 degrees and (2) a random distribution of dihedral angles which potentially define the four-atom bond-length correlation functions.

Preferably, the RCN structure of the non-crystalline oxides may minimize or prevent crystallization or phase separation at temperatures extending to more than about 1000° C.

In one embodiment, each of the A and B elements are selected so as to independently have Pauling electronegativity absolute value differences with respect to oxygen that range from about 1.6 to about 2. In another embodiment, the Pauling electronegativity absolute value differences with respect to oxygen for elements A and B range from about 1.5 to about 2.1.

Various elements may be employed for A and B. Examples for element A include Group IIIA elements such as, but not limited to, of aluminum (Al), gallium (Ga), and indium (In). Examples for B include Group VB elements such as, but not limited to, tantalum (Ta), vanadium (V), and niobium (Nb). In one embodiment, A is aluminum (Al) and B is tantalum (Ta). In another embodiment, A is aluminum (Al) and B is niobium (Nb).

The noncrystalline oxides of the present invention are distinguishable from oxides formed from Group IIIA and VA elements (e.g., $GaAsO_4$). For the purposes of illustration, it is believed that the oxides formed from Group IIIA and VA elements do not meet the Pauling electronegativity values set forth herein in preferred embodiments. This is because the Pauling electronegativity differences with respect to oxygen for nitrogen (N), phosphorous (P), arsenic (As), and antimony (Sb) are each respectively believed to be less than 1.4. Although not wishing to be bound by theory, it is believed that these oxides are expected to have bonding structures comprised of Group IIIA positive ions and Group VA nitrate, phosphate, arsenate, or antimonate ions such as $NO_4^{3-}$, $PO_4^{3-}$, $AsO_4^{3-}$, and $SbO_4^{3-}$, respectively.

The non-crystalline oxides of formula (I) are advantageous in that they may possess high dielectric constants (i.e., k). Preferably, the dielectric constants range at a low end of about 15 or 18 to an upper end of 20 or 25. The non-crystalline oxides may have the potential to significantly reduce direct tunneling leakage currents while achieving a $t_{ox,eq}$ of less than 1 nm. The chemically-ordered nature of these oxides preferably allows for no metal-to-metal bonding occurring within the oxide structures of the invention.

As stated above, the oxides of the invention are non-crystalline. The non-crystallinity may be evaluated using various techniques such as, for example, standard x-ray or electron diffraction imaging (e.g., bright-field dark-field transmission electron microscopy imaging) and by analysis of spectroscopic data via a technique including, for example, Raman scattering, infra-red absorption, and spectroscopic ellipsometry. In one embodiment, the coordination of the constituent metal atoms may be confirmed by numerical/analytic extraction of radial distribution functions from X-ray or electron diffraction data, or from extended atomic fine structure X-ray spectroscopy (EXAFS).

In another aspect, the invention relates to methods of forming the non-crystalline oxides of the invention represented by formula (I). The methods comprise delivering gaseous sources comprising element A, gaseous sources comprising element B, and gaseous sources comprising oxygen on substrates such that the gaseous sources comprising element A, the gaseous sources comprising element B, and the gaseous sources comprising oxygen react to form the non-crystalline oxides. The elements A and B preferably are delivered in amounts necessary (i.e., sufficient) for achieving chemical stoichiometry, i.e., equal concentrations of A and B atoms in the resulting layers (e.g., thin films). The gaseous sources comprising oxygen preferably contains a sufficient amount of oxygen such that the elements A and B are completely oxidized. In one embodiment, the delivery step is carried out as a deposition.

Various gaseous sources comprising element A and gaseous sources comprising element B may be employed for the purposes of the invention. Examples of gaseous sources comprising element A and gaseous sources comprising element B include, but are not limited to, alkoxide compounds, organometallic compounds, inorganic compounds, and mixtures thereof. Preferably, the alkoxide compound is selected from the group consisting of an ethoxide, a propoxide, and a butoxide. When element A is aluminum, it is preferred that the gaseous source comprising element A comprises trimethyl aluminum. Other gaseous sources comprising element A and gaseous sources comprising element B can be used such as organo-metallic source gases including those that are capable of producing the desired binary oxides (e.g., diketonates) along with other organo-metallics that contain metal-oxygen bonds. Other inorganic sources of elements A and B can be employed such as halides and nitrates. The gaseous sources comprising element A and/or element B can be derived through the evaporation of respective liquid sources comprising these elements, particularly in embodiments in which the deposition involves a physical deposition or a plasma chemical vapor deposition process.

A number of sources of oxygen may be employed for the purposes of the invention. Exemplary sources of oxygen include, but are not limited to, oxygen atoms, oxygen ions, oxygen metastables, oxygen molecular ions, oxygen molecular metastables, compound oxygen molecular ions, compound oxygen metastables, compound oxygen radicals, and mixtures thereof. Compounds that can be employed in the gaseous sources include, but are not limited to, $O_2$, $N_2O$, and mixtures thereof. It is particularly preferred that the formation of the non-crystalline oxides take place in non-equilibrium chemical environments.

The gaseous sources comprising element A, element B, and oxygen may further comprise other components such as, for example, inert gases (e.g., argon (Ar) helium (He), or other noble gases, as well as mixtures thereof).

A number of deposition techniques can be used in forming the non-crystalline oxides of the invention. Exemplary techniques include, but are not limited to, a laser-assisted chemical vapor deposition, a direct or remote plasma assisted chemical vapor deposition, a electron cyclotron resonance chemical vapor deposition, and a reactive physical vapor deposition. In a preferred embodiment, a remote plasma assisted chemical deposition is employed. Various reactive physical vapor depositions can be used such as, for example, a thermal evaporation, an electron beam evaporation, a parallel plate radio frequency (rf) sputtering, a direct current (dc) sputtering, a radio frequency (rf) magnetron sputtering, and a direct current (dc) magnetron sputtering. A reactive physical vapor deposition may also occur in the form of an atomic layer absorption process. The invention is preferably carried out by remote plasma-enhanced chemical vapor deposition (i.e., REPCVD).

The methods of the invention may be carried out under any number of temperature and pressure conditions. With respect to temperature, the methods are preferably carried out from about 250° C. to about 400° C. With respect to pressure, the methods are preferably carried out from about 200 milli-Torr to about 500 milli-Torr.

The methods of the invention may be carried out using known equipment, including, for example, a suitable reactor (e.g., reaction chamber or vessel). In one embodiment, alkoxide liquids comprising elements A and B are injected into a reactor downstream from a remote radio-frequency excited plasma. Preferably, the alkoxides are liquids at room temperature, but at the temperature range employed in the reactor have sufficient levels of vapor to be transported into the reactor. A microwave plasma may be employed if so desired.

The gaseous source comprising oxygen is preferably plasma-excited, typically by being subjected to a radio-frequency or microwave-frequency source. The gaseous source comprising oxygen is preferably present in combination with an inert gas such as, for example, a rare gas such as, but not limited to, helium (He) or argon (Ar)). Preferably, the gaseous source comprising oxygen is injected into the reactor at a high flow rate (e.g., 200 standard cubic centimeter per second (SCCM) through a tube with an inside diameter of about one inch) through a plasma tube at a location upstream relative to where the gaseous source comprising element A and the gaseous source comprising element B are injected into the reactor. The above injection configuration is believed to be potentially advantageous since it may minimize backstreaming of the gaseous sources comprising element A and the gaseous sources comprising element B. See e.g., G. Lucovsky, *IBM J. of Res. and Devel.* 43, 301 (1999).

Other techniques can be employed to provide for the deposition of the non-crystalline oxide materials in a highly oxidizing environment. Exemplary techniques include, but are not limited to, embodiments involving plasma deposition such as direct plasma deposition in conventional parallel plate reactors, triode plasma deposition, electron-cyclotron-resonance plasma deposition, laser-assisted deposition, and reactive physical vapor deposition using ozone, plasma-excited oxygen, or laser excited oxygen.

The invention also relates to the incorporation of the non-crystalline oxides of the invention into integrated circuit devices, particularly very large scale integration (VLSI) devices including Insulated Gate Field Effect Transistors (IGFET), also referred to as MOSFET or CMOS devices. As an example, the invention provides field effect transistors including gate insulators comprising the non-crystalline oxides of the invention represented by the formula (I). For the purposes of illustration, embodiments describing field effect transistors are set forth in FIGS. 1 through 3. One example of a field effect transistor is set forth in FIG. 1 as 10. The field effect transistor comprises an integrated circuit substrate 20 having a first surface 25. Source and drain regions 30 and 40 respectively are present in the substrate 20 at the first surface 25 in a spaced apart relationship. A gate insulating layer 50 is present on the substrate 20 at the first surface 25 between the spaced apart source and drain regions, 30 and 40 respectively. The gate insulating layer 50 comprises the non-crystalline oxide represented by the formula (I) set forth herein. Source, drain, and gate contacts (60, 70, and 80 respectively) are also present and contact source and drain regions 30 and 40 and the gate insulating layer 50.

A number of materials can be employed in the integrated circuit substrate, the selection of which are known by those skilled in the art. As an example, the substrate may comprise a material selected from the group consisting of a Group III–V binary alloy, a Group III–V quaternary alloy, a Group III-nitride alloy, and combinations thereof. Examples of Group III–V binary alloys include, but are not limited to, (Ga,Al)As, (In,Ga)As, and combinations thereof. An example of a Group III–V quaternary alloy includes, but is not limited to, (Ga,In)(As,P). Examples of Group III-nitride alloys include, but are not limited to, (Ga,Al)N, (Ga,In)N, (Al,In)N, (Ga,Al,In)N, and combinations thereof. Ternary alloys of the above may also be employed.

Other examples of materials that may be employed in the integrated circuit substrate include, but are not limited to, silicon (Si), germanium (Ge), silicon carbide (SiC), gallium nitride (GaN), gallium arsenide (GaAs), as well as other compounds from Groups III and V. Combinations thereof may also be employed.

The integrated circuit substrate may encompass a number of specific substrates that are employed in devices of this type. One example of a substrate is a semiconductor-on-insulator (SOI) substrate.

The source, drain, and gate contacts may include those that are conventionally known in the art. As an example, the gate contact may be formed from polysilicon and/or metal materials.

The field effect transistor may also include other layers of materials. For example, in one embodiment (not shown), the field effect transistor may include an interfacial layer positioned between the substrate and the gate insulating layer. In a preferred embodiment, the interfacial layer comprises an oxide. Other insulating materials may be employed. Preferably, the interfacial layer comprises silicon dioxide ($SiO_2$) in the event that the substrate comprises Si or SiC. Other interfacial layers such as those comprising gallium oxide ($GaO_3$), aluminum oxide ($Al_2O_3$), or alloys thereof, may be preferable for use with compounds from Groups III and V along with their alloys. The use of the interfacial layer may be particularly advantageous in electron-channel (n-channel) FETs and hole-channel (p-channel) FETs. In a preferred embodiment, the interfacial layer contributes less than 0.5 nm of oxide-equivalent capacitance to the field effect transistor. In general, the use of an interfacial layer is believed to be advantageous in that it may: (1) prevent or minimize further oxidation of the silicon substrate during film deposition in highly oxidizing environments, (2) prevent or minimize formation of silicide bonds during the initial stages of deposition of the non-crystalline oxide materials, particularly with respect to, for example, the formation of Ta—Si bonds during the deposition of $AlTaO_4$.

Figure 2:
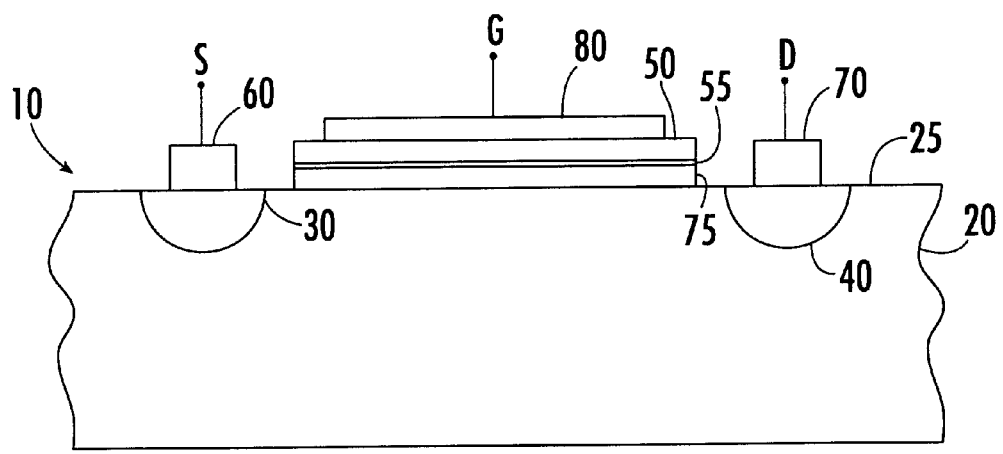
FIG. 2 illustrates a second embodiment of a field effect transistor comprising a non-crystalline oxide of the invention.

Referring now to FIG. 2, an additional layer 55 is depicted between the interfacial layer 75 and the integrated circuit substrate 20 in field effect transistor 10. In this embodiment, the additional layer is in the form of a nitrided monolayer, the selection of which is known in the art.

Figure 3:
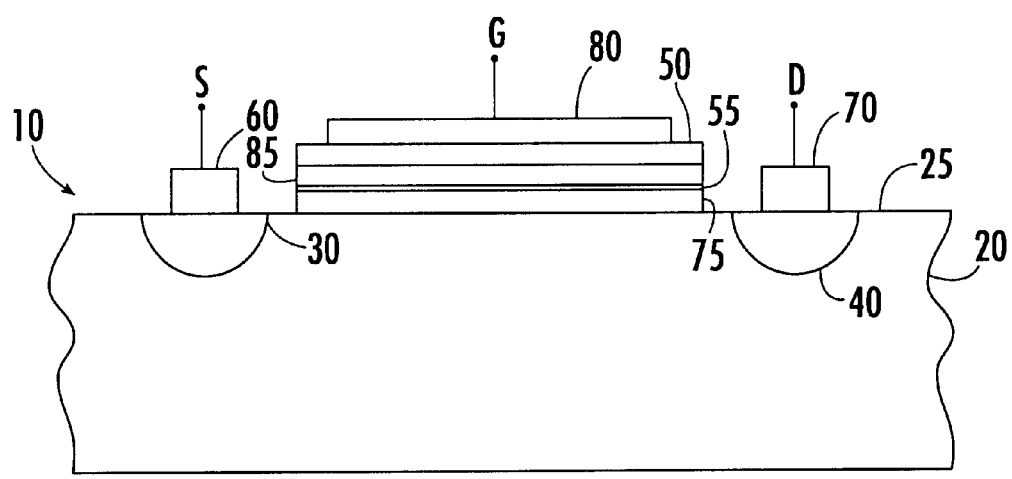
FIG. 3 illustrates a third embodiment of a field effect transistor comprising a non-crystalline oxide of the invention.

Referring now to FIG. 3, other layers may be included in field effect transistor 10. For example, a graded layer 85 may be present between gate insulating layer 50 and the interfacial layer 75. The graded layer 85 may comprise a number of components including, but not limited to, elements, alloys, oxides, and combinations thereof. For example, the graded layer may comprise a binary oxide, a ternary oxide, or combinations thereof, including, as an example, the non-crystalline oxides of the invention as well as a native oxide component of a substrate employed in the field effect transistor (e.g., a semiconductor substrate). In one embodiment, the graded layer 85 may comprise $SiO_2$ as one component of a ternary oxide.

The graded layer may be of various types as known to one skilled in the art. For example, the amount of material that traverses across the graded layer may increase linearly or non-linearly (e.g., parabolicly). The grading may be selected as desired by the skilled artisan.

In one embodiment, the graded layer may be a chemically graded layer. Various materials (e.g., oxides) may be employed in the chemically graded layer. Exemplary oxides include the following: (1) $SiO_2$-a Group VB element, (2) $SiO_2$-a Group IIIA element, and (3) $SiO_2$-a Group IIIA element-a Group VB element. Combinations thereof may also be employed. More specific examples of these materials are as follows: (1) $SiO_2$—$Ta_2O_5$, (2) $SiO_2$—$Al_2O_3$, and (3) $SiO_2$—$Al_2O_3$—$Ta_2O_5$. Combinations thereof may also be used. See e.g., G. D. Alers, *Appli. Phys. Letters,* Vol. 73, p. 1517 (1998).

Although the graded layer is used in conjunction with a nitrided monolayer as depicted in FIG. 3, it should be appreciated that the graded layer may be employed in embodiments in which the monolayer is not present. Although not necessarily depicted in the drawings, additional graded layers, as well as other layers of materials that are typically employed in stacked dielectrics, may be encompassed within the scope of the invention.

The field effect transistor described herein may be fabricated by methods known to a person skilled in the art. For example, a gate insulating layer may be formed by depositing the non-crystalline oxide of the invention on the substrate of the field effect transistor by employing an appropriate technique including, but not limited to, those described herein. In a preferred embodiment, an interfacial layer is formed on a substrate of the field effect transistor by a suitable process such as, but not limited to, remote plasma-assisted oxidation, low pressure thermal oxidation, chemical oxidation, or photo-assisted oxidation. Thereafter, the gate insulating layer is formed by depositing the non-crystalline oxide material on the interfacial layer in the same deposition chamber used to form the interfacial layer. Alternatively, an in-line system with substrate transfer in either a high vacuum or inert environment can be used, in which it is preferred that chemical reactions with the interfacial layer are minimized or prevented.

As described herein, in various embodiments, the non-crystalline oxides may be employed in field effect transistors as thin gate insulating layers having high dielectric constants. Advantageously, the non-crystalline oxides potentially allow for field effect transistors employing the same to possess gate capacitance in excess of what may possibly be achieved with conventional insulating layers with significantly reduced direct tunneling currents. As an example, the direct tunneling currents may be reduced from levels in excess of 1 A/cm$^2$.

It should be appreciated that the combination described hereinabove of interfacial layers (e.g., oxides) with the oxides of the invention may be used, for example, as passivation layers in other types of semiconductor devices including, but not limited to, photodiodes, photoconductors, light-emitting diodes, semiconductor lasers, bipolar transistors and other semiconductor devices in which control of surface properties is desired.

The invention will now be illustrated by the following examples.

It should be appreciated that the examples are for illustrative purposes only, and are not to be construed as limiting the invention as defined by the claims.

EXAMPLE 1

A field effect transistor is formed according to the following procedure. Radio frequency remote plasma assisted oxidation using oxygen as the source gas is employed to form an SiO$_2$ insulating layer on a Si-containing substrate. The above process is carried out at 300° C. A non-crystalline oxide comprising aluminum and tantalum is formed on the insulating layer via a radio frequency remote plasma enhanced CVD deposition carried out at 300° C. The structure is then exposed to a post deposition rapid thermal anneal in an inert, non-oxidizing ambient such as helium or argon for e.g., 30 seconds at 900° C.

The resulting field effect transistor has an SiO$_2$ insulating layer with a thickness of less than 0.5 nm (i.e., 5 Å) and a gate insulating layer thickness of more than 2.0 nm (i.e., 20 Å).

EXAMPLE 2

A field effect transistor is formed according to the procedure set forth in Example 1 with the following modifications. The substrate is exposed to an N$_2$ remote plasma to allow for the formation of a nitrided monolayer on the substrate. The other layers are formed in the manner previously described.

EXAMPLE 3

A field effect transistor is formed according to the procedure set forth in Example 1 with the following modifications. A remote plasma assisted oxidation using N$_2$O instead of O$_2$ is employed to form the nitrided monolayer thereon with the interfacial layer thereon.

The invention has been described by various embodiments set forth in the detailed description, drawings, and examples. It should be noted, however, that the invention is not limited by these embodiments, but is defined in scope by the claims that follow.

What is claimed is:

1. A method of forming a non-crystalline oxide represented by the formula:

$$ABO_4$$

wherein A is an element selected from Group IIIA of the periodic table and B is an element selected from Group VB of the periodic table, said method comprising:
delivering a gaseous source comprising element A, a gaseous source comprising element B, and a gaseous source comprising oxygen on a substrate such that the gaseous source comprising element A, the gaseous source comprising element B, and the gaseous source comprising oxygen react to form the non-crystalline oxide.

2. The method according to claim 1, wherein elements A and B are present in amounts sufficient to achieve chemical stoichiometry, and wherein the gaseous source comprising oxygen contains a sufficient amount of oxygen such that the elements A and B are completely oxidized.

3. A method according to claim 1, wherein the oxygen in the gaseous source comprising oxygen-containing source is selected from the group consisting of oxygen atoms, oxygen ions, oxygen metastables, oxygen molecular ions, oxygen molecular metastables, compound oxygen molecular ions, compound oxygen metastables, compound oxygen radicals, and mixtures thereof.

4. A method according to claim 1, wherein the gaseous source comprising oxygen comprises O$_2$ or N$_2$O.

5. A method according to claim 1, wherein said delivering step is a remote plasma-enhanced chemical vapor deposition occurring in a reactor, and wherein the remote-plasma-enhanced chemical vapor deposition comprises:
subjecting the gaseous source comprising oxygen to radio-frequency plasma-excitation or microwave frequency plasma-excitation, the gaseous source comprising oxygen further comprising a rare gas element;
wherein the gaseous oxygen-containing source is injected into the reactor upstream relative to the gaseous source comprising element A and the gaseous source comprising element B.

6. A method according to claim 5, wherein the rare gas element is selected from the group consisting of argon (Ar) and helium (He).

7. A method according to claim 1, wherein each of the gaseous source comprising element A and the gaseous source comprising element B independently comprise at least one compound selected from the group consisting of an alkoxide compound, an organometallic compound, and an inorganic compound.

8. A method according to claim 7, wherein the at least one compound is an alkoxide compound selected from the group consisting of an ethoxide, a propoxide, and a butoxide.

9. A method according to claim 1, wherein the element A is aluminum (Al) and the gaseous source comprising element A comprises trimethyl aluminum.

10. A method according to claim 1, wherein each of the A and B elements independently have Pauling electronegativity absolute value differences with respect to oxygen that range from about 1.6 to about 2.

11. A method according to claim 1, wherein each of the A and B elements independently have Pauling electronegativity absolute value differences with respect to oxygen that range from about 1.5 to about 2.1.

12. A method according to claim 1, wherein A is aluminum (Al) and B is tantalum (Ta).

13. A method according to claim 1, wherein A is aluminum (Al) and B is niobium (Nb).

14. A method according to claim 1, wherein A is selected from the group consisting of aluminum (Al), gallium (Ga), and indium (In).

15. A method according to claim 1, wherein B is selected from the group consisting of tantalum (Ta), vanadium (V), and niobium (Nb).

16. A method according to claim 1, in which said delivering step is selected from the group consisting of a laser-assisted chemical vapor deposition, a direct plasma assisted chemical vapor deposition, an electron cyclotron resonance chemical vapor deposition, and a reactive physical vapor deposition.

17. A method according to claim 16, wherein said delivering step is a reactive physical vapor deposition selected from the group consisting of a thermal evaporation, an electron beam evaporation, a parallel plate radio frequency (rf) sputtering, a direct current (dc) sputtering, a radio frequency (rf) magnetron sputtering, and a direct current (dc) magnetron sputtering.

18. A method according to claim 16, wherein said delivering step is a reactive physical deposition comprising forming at least one of the gaseous source of element A or the gaseous source of element B by evaporating at least one liquid source comprising element A or element B.

19. A method according to claim 16, wherein the reactive physical deposition is an atomic layer absorption process.

* * * * *